(12) United States Patent
Bayram et al.

(10) Patent No.: US 10,056,251 B2
(45) Date of Patent: Aug. 21, 2018

(54) HETERO-INTEGRATION OF III-N MATERIAL ON SILICON

(71) Applicant: INTERNATIONAL BUSINESS MACHINES CORPORATION, Armonk, NY (US)

(72) Inventors: Can Bayram, Ossining, NY (US); Christopher P. D'Emic, Ossining, NY (US); Devendra K. Sadana, Pleasantville, NY (US); Jeehwan Kim, Los Angeles, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/377,409

(22) Filed: Dec. 13, 2016

(65) Prior Publication Data
US 2017/0092483 A1    Mar. 30, 2017

Related U.S. Application Data

(62) Division of application No. 14/796,730, filed on Jul. 10, 2015, now Pat. No. 9,601,583.

(60) Provisional application No. 62/024,503, filed on Jul. 15, 2014.

(51) Int. Cl.
| | |
|---|---|
| *H01L 29/15* | (2006.01) |
| *H01L 21/00* | (2006.01) |
| *H01L 21/04* | (2006.01) |
| *H01L 21/02* | (2006.01) |
| *H01L 29/04* | (2006.01) |
| *H01L 29/06* | (2006.01) |
| *H01L 21/302* | (2006.01) |
| *H01L 29/66* | (2006.01) |
| *H01L 29/20* | (2006.01) |
| *H01L 29/778* | (2006.01) |
| *H01L 29/861* | (2006.01) |

(52) U.S. Cl.
CPC ...... *H01L 21/0254* (2013.01); *H01L 21/0243* (2013.01); *H01L 21/02381* (2013.01); *H01L 21/02433* (2013.01); *H01L 21/02458* (2013.01); *H01L 21/02546* (2013.01); *H01L 21/302* (2013.01); *H01L 29/045* (2013.01); *H01L 29/0649* (2013.01); *H01L 29/0657* (2013.01); *H01L 29/6656* (2013.01); *H01L 29/66522* (2013.01); *H01L 29/2003* (2013.01); *H01L 29/7786* (2013.01); *H01L 29/861* (2013.01)

(58) Field of Classification Search
CPC ............ H01L 21/0254; H01L 21/302; H01L 29/0649; H01L 29/2003; H01L 29/66522; H01L 29/6656
USPC ................ 257/76; 438/25, 64, 510
See application file for complete search history.

(56) References Cited

U.S. PATENT DOCUMENTS

| | | |
|---|---|---|
| 8,530,938 B2 | 9/2013 | Briere |
| 9,666,684 B2 | 5/2017 | Basu et al. |

(Continued)

*Primary Examiner* — Dzung Tran
(74) *Attorney, Agent, or Firm* — Tutunjian & Bitetto, P.C.; Louis J. Percello

(57) ABSTRACT

A hetero-integrated device includes a monocrystalline Si substrate and a trench formed in the substrate to expose a crystal surface at a bottom of the trench. Sidewall dielectric spacers are formed on sidewalls of the trench, and a III-V material layer is formed on the crystal surface at the bottom of the trench and is isolated from the sidewalls of the trench by the sidewall dielectric spacers.

7 Claims, 3 Drawing Sheets

(56) References Cited

U.S. PATENT DOCUMENTS

| | | | | |
|---|---|---|---|---|
| 2004/0012037 A1* | 1/2004 | Venkatesan | ....... | H01L 21/76251 257/200 |
| 2006/0003512 A1* | 1/2006 | Gonzalez | .......... | H01L 21/82341 438/199 |
| 2006/0019462 A1* | 1/2006 | Cheng | ............... | H01L 21/82341 438/400 |
| 2007/0087525 A1* | 4/2007 | Chen | ................. | H01L 21/76254 438/429 |
| 2007/0241403 A1* | 10/2007 | Thean | ............... | H01L 21/82380 257/351 |
| 2008/0099785 A1* | 5/2008 | Bai | ....................... | C30B 25/183 257/190 |
| 2011/0108850 A1* | 5/2011 | Cheng | ................ | H01L 21/8252 257/76 |
| 2015/0206796 A1 | 7/2015 | Dasgupta et al. | | |

* cited by examiner

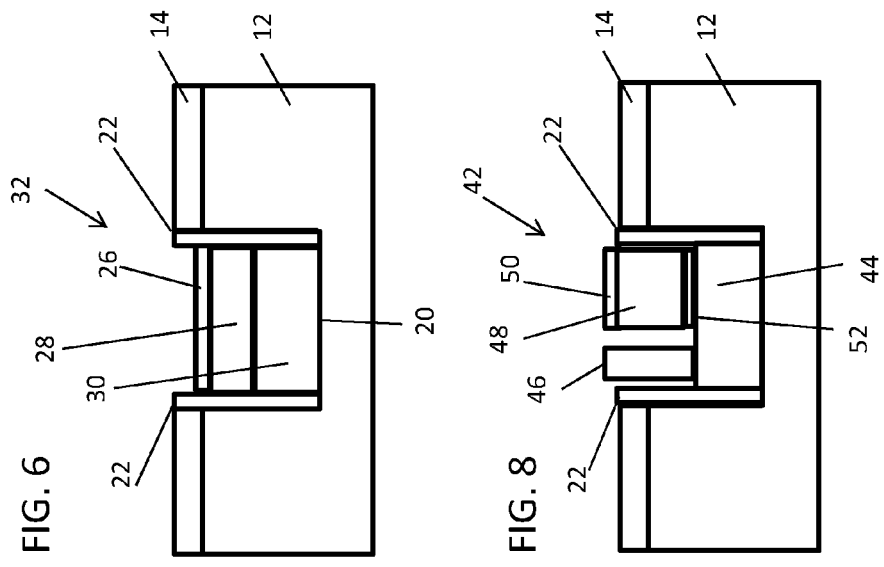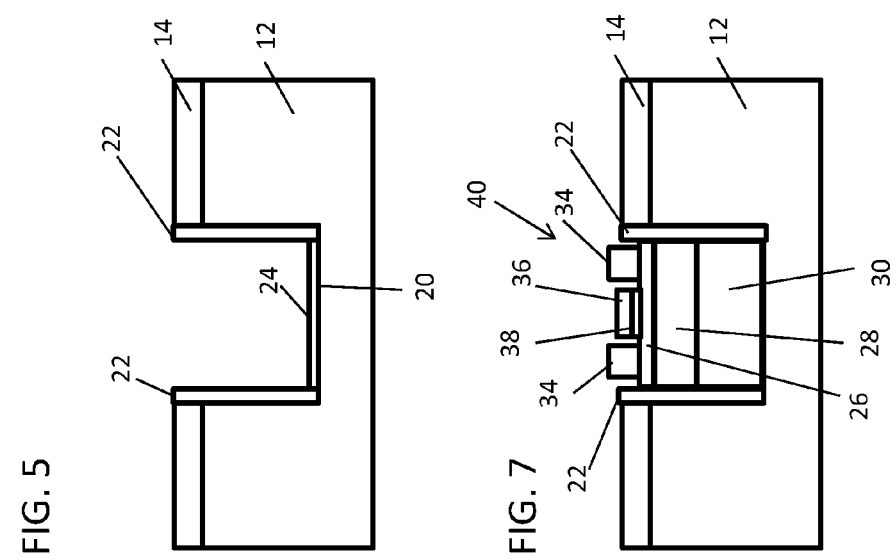

HETERO-INTEGRATION OF III-N MATERIAL ON SILICON

CROSS REFERENCE TO RELATED APPLICATIONS

This application is a Divisional Application of co-pending U.S. application Ser. No. 14/796,730, filed on Jul. 10, 2015, which claims priority to Provisional Application Ser. No. 62/024,503, filed on Jul. 15, 2014, both of which are incorporated herein by reference in their entirety.

BACKGROUND

Technical Field

The present invention relates to semiconductor devices and processing, and more particularly to devices and methods for forming III-V materials on a silicon based wafer while avoiding stress and cracking.

Description of the Related Art

Many high frequency and high performance devices are employed using GaN and GaAs substrate materials. However, forming substrates from these materials tends to be more expensive than employing Si wafers and Si processing techniques. The cost of substrates becomes a bottleneck to the wide scale adoption of the substrate material for these high performance discrete devices. In addition, conventional substrates, such as sapphire and silicon carbide are expensive and have limited availability in larger diameters (i.e., these are typically limited to 4-inch substrates).

Silicon remains more moderate in cost and can provide larger diameter substrates. However, lattice and thermal mismatch between Si and GaN is on the order of 50%. These mismatches can lead to cracking issues for regrown GaN on Si wafers.

SUMMARY

A hetero-integrated device includes a monocrystalline Si substrate and a trench formed in the substrate to expose a crystal surface at a bottom of the trench. Sidewall dielectric spacers are formed on sidewalls of the trench, and a III-V material layer is formed on the crystal surface at the bottom of the trench and is isolated from the sidewalls of the trench by the sidewall dielectric spacers.

Another hetero-integrated device includes a monocrystalline Si substrate and a trench formed in the substrate to expose a (111) crystal surface at a bottom of the trench. Sidewall dielectric spacers are formed on sidewalls of the trench and remnants of an AlN layer are reacted with the crystal surface at a bottom of the trench. A III-N electronic device is formed in the trench. The electronic device includes at least one GaN layer epitaxially formed on the crystal surface at the bottom of the trench and isolated from the sidewalls of the trench by the sidewall dielectric spacers.

A method for forming a hetero-integrated device includes opening up a dielectric layer formed on a monocrystalline Si substrate; etching a trench in the substrate through the opening to expose a crystal surface at a bottom of the trench; depositing sidewall dielectric spacers on sidewalls of the trench; and growing at least one III-V material layer on the crystal surface at the bottom of the trench, the at least one III-V material layer being isolated from the sidewalls of the trench by the sidewall dielectric spacers.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 5 is a cross-sectional view of the substrate of FIG. 4 showing a protection layer formed in the trench on a bottom surface, which is later removed, in accordance with the present principles;

FIG. 6 is a cross-sectional view of the substrate of FIG. 5 showing the protection layer removed and III-V (III-N) materials grown from the Si surface in accordance with the present principles;

FIG. 7 is a cross-sectional view of the substrate of FIG. 6 showing the III-V (III-N) materials grown from the Si surface forming a high electron mobility transistor (HEMT) in accordance with the present principles;

FIG. 8 is a cross-sectional view of the substrate showing the III-V (III-N) materials forming a diode in accordance with the present principles.

DETAILED DESCRIPTION

Figure 2:
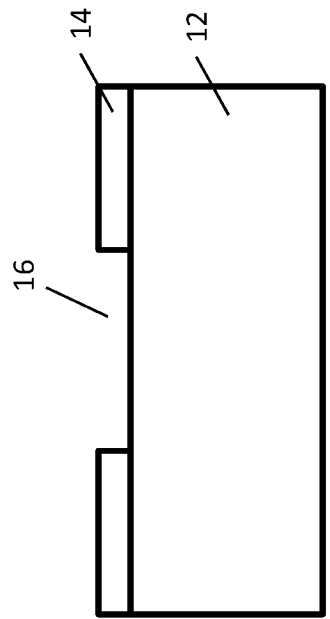
FIG. 2 is a cross-sectional view of the substrate of FIG. 1 showing the dielectric layer opened up to expose the silicon substrate in accordance with the present principles.

In accordance with the present principles, devices and methods are provided that form hetero-integrated devices using, e.g., III-V materials on a silicon based wafer. The present principles provide III-V devices that can be grown on a silicon based platform that do not suffer from cracking and strains associated with lattice mismatch. In one particularly useful embodiment, a silicon substrate is patterned to from one or more trenches in the Si substrate. A dielectric is formed on in the trench (e.g., an oxide or nitride). The III-V material is grown in the trench on a silicon-based substrate, which enables the formation of transistor structures (e.g., high electron mobility transistors (HEMT)), light emitting diodes, or other high performance electronic devices. Many of the benefits of Si are realized with the benefits of high performance III-V materials. In one embodiment, an oxide field region and an oxide sidewall spacer are employed to provide to crack-free GaN for HEMT structures as large as, e.g., 200 microns by 200 microns suitable for buck converters or other devices.

In particularly useful embodiments, a silicon-on-insulator (SOI) substrate may be employed. An oxide may be deposited on top for protection, and a deep etch into a Si (111) wafer (the semiconductor layer of the SOI) may be performed. Then, the sidewall oxide (or nitride) may be formed to prevent nucleation of GaN or other III-V material from the sidewalls. This sidewall oxide prevents the III-V material from cracking and device using the sidewall oxide material are 100% crack-free, in all available dimensions, e.g., from 50 microns by 50 microns to 200 microns by 200 microns. Other dimensions are also contemplated.

The present technology can be used for any III-V based devices and for integration of highly thermal mismatched substrates. While the present principles are applicable to III-V materials, the present principles are particularly useful with III-N (III-nitride) materials, and in particularly GaN, which has a number of features that are useful in device structures as well as device fabrication processes.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., AlN, InGaAs or GaN. These compounds include different proportions of the elements within the compound, e.g., InGaAs includes $In_x Ga_y As_{1-x-y}$, where x, y are less than or equal to 1, or GaN includes $Ga_x N_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
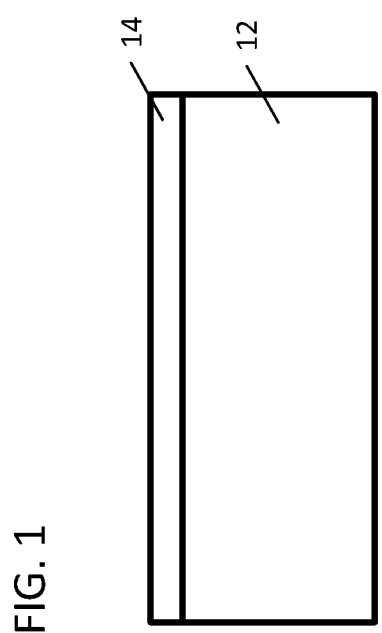
FIG. 1 is a cross-sectional view of a silicon substrate (e.g., bulk or SOI) having a dielectric layer formed thereon in accordance with the present principles.

Referring now to the drawings in which like numerals represent the same or similar elements and initially to FIG. 1, a substrate 12 includes a silicon based substrate. In a particularly useful embodiment, the substrate 12 includes a monocrystalline silicon substrate. The monocrystalline silicon substrate 12 may include a planar (111) orientation Si substrate. The substrate 12 may include a bulk substrate or a silicon-on-insulator (SOI) substrate. A dielectric layer 14 is formed or deposited in the substrate 12. The dielectric layer 14 may include an oxide and may be grown on the silicon of substrate 12. Alternatively, layer 14 may be deposited by a deposition process, such as, e.g., chemical vapor deposition or other suitable process. The dielectric layer 14 may include a thickness of between about 50 nm to about 200 nm, more preferably about 100 nm.

Referring to FIG. 2, a patterning process may be employed to open up the dielectric layer 14 to form a recess or opening 16. The patterning process may include the formation of a lithographically formed resist (not shown). The resist may be employed as a mask, or additional layers may be formed on the dielectric layer 14 and employed as a mask to etch, not only the dielectric layer but also the substrate 12. The etch process may include a dry etch or a reactive ion etch (RIE). Other suitable etching and patterning processes may be employed.

Figure 3:
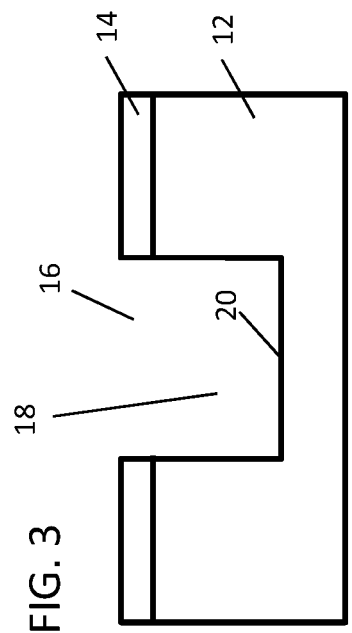
FIG. 3 is a cross-sectional view of the substrate of FIG. 2 showing the silicon substrate etched through the opening to form a trench, the etch can stop after a depth is reached or after a desired crystal surface is exposed in accordance with the present principles.

Referring to FIG. 3, the etching process may be continued or may be adjusted to etch away the substrate 12 material in accordance with the opening 16 (or pattern) to form a trench 18. The etching process continues until a Si (111) surface 20 is exposed for later forming III-V materials as will be described. The trench 18 may include a depth of between about 1 to 2 microns and in one embodiment the trench 18 has a depth of about 1.5 microns. The depth and the exposure of crystallographic surfaces may depend on the type of device and the application of the device to be fabricated.

Figure 4:
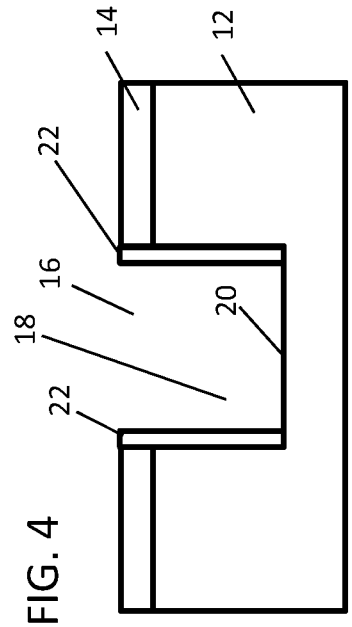
FIG. 4 is a cross-sectional view of the substrate of FIG. 3 showing sidewall dielectric spacers formed on sidewalls of the trench in accordance with the present principles.

Referring to FIG. 4, a conformal dielectric material is deposited to form spacers 22. The dielectric material may be deposited to cover all surfaces and is then subjected to a RIE to remove the dielectric materials from horizontal surfaces to form spacers 22 and to clean the surface (field) 20. The spacers 22 may include nitride, oxide, oxynitride or other suitable dielectric. The spacers 22 may include a thickness of between about 30 nm to about 100 nm, and more preferably about 70 nm thick, although other dimensions are contemplated. The spacers 22 cover all vertical surfaces of the trench 18.

Referring to FIG. 5, a protection layer 24 is formed on the surface or field 20 to protect the Si surface 20 from the components of the III-V layers to be formed. The protection layer may include, e.g., AlN (for a GaN layer to be formed). The protection layer 24 is then etched away from the surface 20 and spacers 22, and/or polished away (or etched) from the dielectric layer 14. The protection layer 24 is completely removed; however, the interaction and residue remaining on the surface 20 serves to protect the structure of surface 20. In one example, the surface 20 is protected from Ga atoms and $NH_3$, which are employed in the fabrication of GaN layers and devices. Other protection layer materials may be selected depending on the III-V material to be formed.

Referring to FIG. 6, a material 32 is grown on the field or surface 20 of the substrate 12. The material may include GaN, GaAs, AlGaAs, InGaAs, AlN, or other III-V materials and combinations thereof. In particularly useful embodiments, the material 32 includes a III-N material, such as e.g., GaN, AlN, InN, AlGaN, etc. In one embodiment, the material 32 is employed to form a transistor (e.g., HEMT), diode, (light emitting diode), laser or other device. In one particularly useful embodiment, the material 32 may form a GaN based HEMT and include multiple layers, such as, a AlGaN layer 26, a GaN layer 28 and an undoped GaN layer 30. Layer 26 may be about 30 nm in thickness and include a composition of $Al_{0.25}Ga_{0.75}N$. Layer 28 may include a doped GaN layer of about 500 nm in thickness, and layer 30 may include undoped GaN with a thickness of about 1 micron. Other structures and materials are also contemplated in accordance with the present principles.

It should be understood that while the layers 26, 28 and 30 may be formed from GaN or GaN-based materials, other III-V materials and device structures may be employed. The III-V material layers (32) are grown from the surface 20 on substrate 12 within a dielectric walled trench (18). By providing the dielectric buffered walls, the present principles provide a significant reduction in stress/strain of the epitaxially grown material 32.

Referring to FIG. 7, a HEMT structure 40 may be completed by forming source and drain contacts 34 and a gate metal 36. The contacts 34 may be formed from one or more of, e.g., Ti, Au, Pt, Al, Ni, etc. The gate metal 36 may include, e.g., Pt, Au, Ni, etc. The gate metal 36 is formed on a gate dielectric 38. The gate dielectric 38 may include a high-k dielectric (e.g., $HfO_2$), silicon oxide, etc.

Referring to FIG. 8, other structures may be formed as well. For example, in one embodiment, a diode 42 is formed in the trench (18). A structure of the diode 42 may include an n-doped GaN layer 44 having a contact 46 formed thereon. The diode 42 further includes a p-doped GaN layer 48 having a contact 50 formed thereon. A p-n junction 52 forms between the n-doped GaN layer 44 and the p-doped GaN layer 48. It should be understood that the structures depicted may include additional layers or different layers in accordance with the particular design and application. For example, the diode (or laser) 42 made in an multiple quantum well (MQW) structure at the junction 52 or the HEMT, diode, laser, etc. may include buffer layers, additional contacts, etc. as the case may be.

In accordance with the present principles, the use of sidewalls when growing III-V or III-N materials on silicon, resulted in crack-free device formation. The sidewall spacers in the trenches prevented the development of significant stress or strain between the silicon substrate and the III-N material being grown.

For example, in testing performed by the inventors, GaN was grown on silicon in trenches in different device patterns. One pattern included device sizes of 200 microns by 100 microns. For the 200 microns by 100 microns devices, 4 of 20 devices developed cracks. In device sizes 150 microns by 150 microns of another pattern, 3 of 30 devices developed cracks.

In accordance with the present principles, nitride spacers were formed on sidewalls, and the same device patterns were employed for growing GaN on silicon in trenches as described above. In device sizes 200 microns by 100 microns, 0 of 20 devices developed cracks. In device sizes 150 microns by 150 microns, 0 of 30 devices developed cracks.

Figure 9:
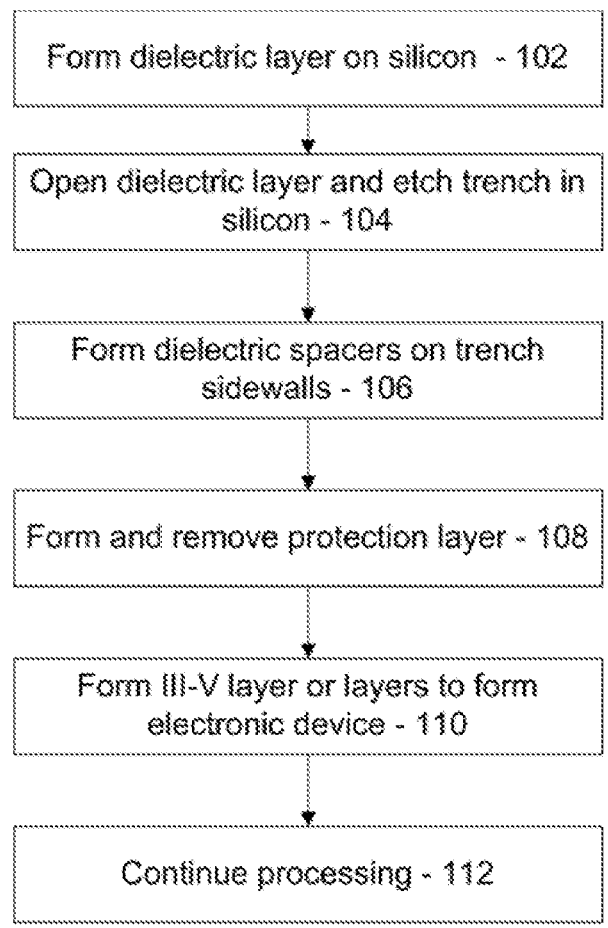
FIG. 9 is a block/flow diagram showing a method for forming a hetero-integrated device in accordance one illustrative embodiments.

Referring to FIG. 9, a method for forming a hetero-integrated device is illustrative shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a dielectric layer formed on a monocrystalline Si substrate is opened up. The opening may be etched using a patterned resist or other mask. The dielectric layer may include a grown oxide or a deposited oxide. Other dielectric materials may also be employed (e.g., silicon nitride). In block 104, a trench is etched into the substrate through the opening to expose a crystal surface at a bottom of the trench. The dielectric layer may be employed as a mask to etch away the substrate. Other alternatives may include using the same mask employed for forming the opening in the dielectric layer, or forming a new mask to etch the substrate. The etch may include a reactive ion etch or a dry etch. The etching may stop after a depth of the trench has been reached, e.g., a timed etch or after a desired crystal plane (e.g., a (111) crystal surface at the bottom of the trench) has been exposed. The substrate may include etching the trench in a silicon layer of a silicon-on-insulator (SOI) substrate.

In block 106, sidewall dielectric spacers are formed on sidewalls of the trench. This may include a blanket conformal deposition of the spacer material and a reactive ion etch to remove the spacer material from horizontal surfaces leaving the spacer on vertical sidewalls. The spacers prevent III-V (e.g., GaN) nucleation on the sidewalls of the trench. The sidewall dielectric spacers may include a nitride or oxide material and may have a thickness of between about 30 nm and 100 nm.

In block 108, a protection layer may be deposited on the crystal surface, and removed. The protection layer adjusts the surface of the silicon to assist in protecting the silicon surface from crystal damage as a result of growth processes. For example, in forming GaN, Ga and $NH_3$ are employed to the GaN. These materials may cause damage to the exposed silicon surface. To protect the surface against Ga and $NH_3$, an AlN protection layer may be employed. The AlN layer conditions the surface such that remnants of the protection layer protect the crystal surface or at least reduce the damage that would otherwise occur. Reducing or eliminating surface damage improved the quality of the grown material (e.g., III-V material or more specifically III-N material).

In block 110, at least one crystalline material layer is grown on the crystal surface at the bottom of the trench. The material layer is isolated from the sidewalls of the trench by the sidewall dielectric spacers. The material preferably includes an epitaxially grown layer using e.g., molecular beam epitaxy (MBE) or metal organic chemical vapor deposition (MOCVD), although other processes may be employed, e.g., atomic layer deposition. The material layer may be included in forming at least one of a transistor, a diode or a laser. The material layer includes III-V material and preferably III-N material.

In block 112, processing can continue to complete the device. This may include the formation of one or more contacts, gates structures, metallizations and connections, etc. The continued processing depends upon the type of structure being formed, among other things.

Having described preferred embodiments for hetero-integration of III-N material on silicon (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A method for forming a hetero-integrated device, comprising:
    opening up a dielectric layer formed on a monocrystalline Si substrate;
    etching a trench in the monocrystalline Si substrate through the opening to expose a continuous crystal surface at a bottom of the trench;
    depositing sidewall dielectric spacers on sidewalls of the trench;
    forming remnants of a protection layer on the continuous crystal surface; and
    growing at least one III-V material layer from the continuous crystal surface at the bottom of the trench, the at least one III-V material layer being isolated from the sidewalls of the trench by the sidewall dielectric spacers.

2. The method as recited in claim 1, wherein forming the remnants of the protection layer further comprises:
    depositing the protection layer on the continuous crystal surface; and
    removing the protection layer from the continuous crystal surface at the bottom of the trench such that reactants from the protection layer protect the continuous crystal surface.

3. The method as recited in claim 2, wherein the at least one III-V material layer includes GaN and the protection layer is formed from AlN.

4. The method as recited in claim 1, wherein the sidewall dielectric spacers include a nitride or oxide material and are formed to have a thickness of between about 30 nm and 100 nm.

5. The method as recited in claim 1, wherein etching the trench includes exposing a (111) crystal surface at the bottom of the trench.

6. The method as recited in claim 1, wherein etching the trench in the substrate includes etching the trench in a silicon layer of a silicon-on-insulator (SOI) substrate.

7. The method as recited in claim 1, wherein growing the at least one III-V material layer includes forming at least one of a transistor, a diode or a laser.

\* \* \* \* \*